US007008751B2

(12) United States Patent
Tao et al.

(10) Patent No.: US 7,008,751 B2
(45) Date of Patent: Mar. 7, 2006

(54) THERMALLY SWITCHABLE IMAGEABLE ELEMENTS CONTAINING BETAINE-CONTAINING CO-POLYMERS

(75) Inventors: Ting Tao, Fort Collins, CO (US); Scott Beckley, Windsor, CO (US)

(73) Assignee: Eastman Kodak Company, Rochester, NY (US)

( * ) Notice: Subject to any disclaimer, the term of this patent is extended or adjusted under 35 U.S.C. 154(b) by 0 days.

(21) Appl. No.: 10/911,781

(22) Filed: Aug. 4, 2004

(65) Prior Publication Data

US 2006/0029881 A1 Feb. 9, 2006

(51) Int. Cl.
*G03F 7/038* (2006.01)
*G03F 7/14* (2006.01)
*G03F 7/26* (2006.01)

(52) U.S. Cl. .................. 430/270.1; 430/302; 430/330; 430/910; 430/964

(58) Field of Classification Search ............ 430/270.1, 430/302, 306, 273.1, 330, 6, 910, 964
See application file for complete search history.

(56) References Cited

U.S. PATENT DOCUMENTS

| | | | | |
|---|---|---|---|---|
| 5,478,690 | A * | 12/1995 | Kanda et al. | 430/175 |
| 5,512,418 | A * | 4/1996 | Ma | 430/271.1 |
| 5,922,512 | A | 7/1999 | DoMinh | |
| 6,165,691 | A | 12/2000 | Damme et al. | |
| 6,190,830 | B1 * | 2/2001 | Leon et al. | 430/270.1 |
| 6,410,202 | B1 | 6/2002 | Fleming et al. | |
| 6,423,469 | B1 | 7/2002 | DoMinh et al. | |
| 6,447,978 | B1 | 9/2002 | Leon et al. | |
| 6,579,622 | B1 | 6/2003 | West | |
| 2002/0123001 | A1 | 9/2002 | Dorr et el. | |

FOREIGN PATENT DOCUMENTS

| | | |
|---|---|---|
| JP | H10-097065 | 4/1998 |

* cited by examiner

*Primary Examiner*—Richard L. Schilling
(74) *Attorney, Agent, or Firm*—Ratner Prestia

(57) ABSTRACT

Imageable elements useful as lithographic printing plate precursors are disclosed. The element comprises an imageable layer over a support. The imageable layer contains a photothermal conversion material and a polymeric binder that comprises a polymer backbone with sulfobetaine- and/or carboxybetaine-containing side chains. The imageable elements do not require processing in a developer. They can be thermally imaged and immediately treated with fountain solution and ink without a development step.

19 Claims, No Drawings

THERMALLY SWITCHABLE IMAGEABLE ELEMENTS CONTAINING BETAINE-CONTAINING CO-POLYMERS

FIELD OF THE INVENTION

The invention relates to lithographic printing. In particular, this invention relates to imageable elements useful as lithographic printing plate precursors that do not require processing in a developer.

BACKGROUND OF THE INVENTION

In conventional or "wet" lithographic printing, ink receptive regions, known as image areas, are generated on a hydrophilic surface. When the surface is moistened with water and ink is applied, the hydrophilic regions retain the water and repel the ink, and the ink receptive regions accept the ink and repel the water. The ink is transferred to the surface of a material upon which the image is to be reproduced. Typically, the ink is first transferred to an intermediate blanket, which in turn transfers the ink to the surface of the material upon which the image is to be reproduced.

Imageable elements useful as lithographic printing plate precursors typically comprise an imageable layer applied over the hydrophilic surface of a substrate. The imageable layer includes one or more radiation-sensitive components, which may be dispersed in a suitable binder. Alternatively, the radiation-sensitive component can also be the binder material. Following imaging, either the imaged regions or the unimaged regions of the imageable layer are removed by a suitable developer, revealing the underlying hydrophilic surface of the substrate. If the imaged regions are removed, the precursor is positive working. Conversely, if the unimaged regions are removed, the precursor is negative working. In each instance, the regions of the imageable layer (i.e., the image areas) that remain are ink-receptive, and the regions of the hydrophilic surface revealed by the developing process accept water and aqueous solutions, typically a fountain solution, and repel ink.

Conventional imaging of the imageable element with ultraviolet and/or visible radiation was carried out through a mask, which has clear and opaque regions. Imaging takes place in the regions under the clear regions of the mask but does not occur in the regions under the opaque regions. However, direct digital imaging, which obviates the need for imaging through a mask, is becoming increasingly important in the printing industry. Imageable elements for the preparation of lithographic printing plates have been developed for use with infrared lasers.

Imaged imageable elements typically require processing in a developer to convert them to lithographic printing plates. Developers are typically aqueous alkaline solutions, which may also contain substantial amounts of organic solvents. Because of their high pH and the presence of organic solvents, disposal of substantial quantities of used developer is expensive and can cause environmental problems. Processing of the imaged imageable element in a developer also introduces additional costs in, for example, the cost of the developer, the cost of the processing equipment, and the cost of operating the process.

To overcome these disadvantages, imageable elements that do not require processing in a developer have been developed. One approach is the use of elements in which the imageable layer comprises a "switchable polymer." Such systems are disclosed, for example, in Leon, U.S. Pat. No. 6,447,978, and DoMinh, U.S. Pat. No. 5,922,512. During thermal imaging and/or subsequent treatment with ink and/or fountain solution, these polymers typically undergo a chemical reaction in which highly polar moieties are either created or destroyed so that the surface of the imageable layer is changed from hydrophobic to hydrophilic, or from hydrophilic to hydrophobic. Not only do these imageable elements not require processing in a developer, they can be imaged on-press, which eliminates the step of mounting the element in a separate imaging device. Thus, a need exists for lithographic printing plate precursors that do not require processing in a developer.

SUMMARY OF THE INVENTION

In one aspect, the invention is an imageable element that does not require processing in a developer. It can be directly mounted on a press after imaging, or imaged on press. The element comprises an imageable layer over a support. The imageable layer consists essentially of a photothermal conversion material and a binder that comprises a polymer backbone with betaine-containing side chains. The betaine may be a sulfobetaine and/or a carboxybetaine.

In another aspect, the polymeric binder comprises K units and L units in which:

the K units are selected from —[$CH_2C(R^1)R^2$]—, —[$CH_2CR^3(CO_2R^4)$]—, —[$CH_2CR^3(CON(R^5)(R^6))$]—, —[$C(R^7)(COECO)C(R^7)$]—, and mixtures thereof;

the L units are selected from —[$CH_2C(R^8)(Q(CH_2)_mN(CH_3)_2(CH_2)_nSO_3)$]—, —[$CH_2C(R^9)(Q(CH_2)_mN(CH_3)_2(CH_2)_nCO_2)$]—, and mixtures thereof;

each $R^1$, $R^3$, $R^7$, $R^8$, and $R^9$, is independently hydrogen, methyl, or a mixture thereof;

$R^2$ is hydrogen, methyl, phenyl, substituted phenyl, halogen, cyano, alkoxy of one to four carbon atoms, acyl of one to five carbon atoms, acyloxy of one to five carbon atoms, vinyl, allyl, or a mixture thereof;

$R^4$, $R^5$, and $R^6$ are each independently hydrogen, alkyl of one to six carbon atoms, cycloalkyl of one to six carbon atoms, phenyl, or a mixture thereof;

E is oxygen or $NR^{10}$ in which $R^{10}$ is hydrogen, hydroxyl, phenyl, substituted phenyl, alkyl of one to six carbon atoms, benzyl, or a mixture thereof;

Q is $CO_2$, O, CONH, $CH_2$, or a mixture thereof;

m is 1 to 8;

n is 2 to 4; and the ratio of K units to L units is about 99:1 to about 1:99.

In another aspect, the invention is a method for forming an image by imaging an imageable element that comprises an imageable layer over the support, and, without a development step, treating the imaged with ink, fountain solution, or a mixture of ink and fountain solution. The imageable layer comprises the photothermal conversion material and a binder that comprises the polymer backbone with betaine-containing side chains.

DETAILED DESCRIPTION OF THE INVENTION

Unless the context indicates otherwise, in the specification and claims, the terms polymeric binder, photothermal conversion material, surfactant, and similar terms also include mixtures of such materials. Unless otherwise specified, all percentages are percentages by weight and all temperatures are in degrees Centigrade (degrees Celsius). Thermal imaging refers to imaging with a hot body, such as a thermal head, or with infrared radiation.

The invention is an imageable element that does not require processing in a developer and a method of forming an image using an imageable element that does not require processing in a developer.

Imageable Element

The imageable element comprises an imageable layer over a substrate. Typically, no other layers are present in the imageable element. Other layers that are conventional components of imageable elements, such as anti-halation layers and/or protective layers may be present, but are not necessary. The imageable layer contains a photothermal conversion material and a polymeric binder. Other conventional ingredients of imageable layers, such as surfactants and dyes, may also be present in the imageable layer.

The imageable layer is thermally switchable. That is, the surface of the imageable layer takes up water and/or an aqueous fountain solution prior to thermal imaging. Following thermal imaging, the imaged regions of the surface of the imageable layer repel water and aqueous fountain solutions, but accepts ink. Therefore, the imageable element doe not need to be processed in a developer.

Polymeric Binders

The polymeric binder is a co-polymer that comprises a polymer backbone with betaine-containing side chains. Typically, the polymeric binder is a co-polymer that comprises K units and L units. The K units are selected from $—[CH_2C(R^1)R^2]—$, $—[CH_2CR^3(CO_2R^4)]—$, $—[CH_2CR^3(CON(R^5)(R^6))]—$, $—[C(R^7)(COECO)C(R^7)]—$, and mixtures thereof. The L units, which comprise the betaine-containing side chains, are selected from $—[CH_2C(R^8)(Q(CH_2)_mN(CH_3)_2(CH_2)_nSO_3)]—$, $—[CH_2C(R^9)(Q(CH_2)_mN(CH_3)_2(CH_2)_nCO_2)]—$, and mixtures thereof. The K and I units are typically the only units present. Small amount other units may be present, but are typically not necessary.

Each $R^1$, $R^3$, $R^7$, $R^8$, and $R^9$ is independently hydrogen or methyl. $R^2$ is independently hydrogen, methyl, phenyl, substituted phenyl, halogen, cyano, alkoxy of one to four carbon atoms, acyl of one to five carbon atoms, acyloxy of one to five carbon atoms, vinyl, or allyl. Substituted phenyl groups include, for example, 4-methylphenyl, 3-methylphenyl, 4-methoxyphenyl, 4-cyanophenyl, 4-chlorophenyl, 4-fluorophenyl, 4-acetoxyphenyl, and 3,5-dichlorophenyl. Halogen includes fluoro (F), chloro (Cl), and bromo (Br). Alkoxy groups of one to four carbon atoms include, for example, methoxy, ethoxy, n-propoxy, iso-propoxy, n-butoxy, and t-butoxy. Acyl of one to five carbon atoms include, for example, $H_3CO—$(acetyl), $CH_3CH_2CO—$, $CH_3(CH_2)_2CO—$, $CH_3(CH_2)_3CO—$, and $(CH_3)_3CCO—$. Acyloxy of one to five carbon atoms include, for example, $H_3CC(O)O—$(acetyloxy), $CH_3CH_2C(O)O—$, $CH_3(CH_2)_2C(O)O—$, $CH_3(CH_2)_3C(O)O—$, and $(CH_3)_3CC(O)O—$. Each $R^4$, $R^5$, and $R^6$ is independently hydrogen, alkyl of one to six carbon atoms, cycloalkyl of one to six carbon atoms, or phenyl. Alkyl groups of one to six carbon atoms, include, for example, methyl, ethyl, n-propyl, iso-propyl, n-butyl, sec-butyl, iso-butyl, t-butyl, n-pentyl, iso-pentyl, neo-pentyl, n-hexyl, iso-hexyl, 1,1-dimethyl-butyl, and 2,2-dimethyl-butyl. Cycloalkyl groups of one to six carbon atoms include, for example, cyclopropyl, cyclobutyl, cyclopentyl, methyl-cyclopentyl, and cyclohexyl. Q is $CO_2$, O, S, CONH, or $CH_2$. m is one to eight. n is two to four.

$—[C(R^7)(COECO)C(R^7)]—$represents a cyclic anhydride or cyclic imide structure, such as is produced on free radical polymerization of maleic anhydride or N-phenyl maleimide. That is, the first and last carbon atoms are bonded by a carbon—carbon single bond. E is oxygen or $NR^{10}$ in which each $R^{10}$ is hydrogen, hydroxyl, phenyl, substituted phenyl, alkyl of one to six carbon atoms, or benzyl.

Mixtures of substituents may used. For example, a betaine-containing co-polymer may comprise K units in which $R^1$ is hydrogen and K units in which $R^1$ is methyl, and/or K units in which $R^2$ is methyl and K units in which $R^2$ is phenyl.

The K units are typically $—[CH_2C(R^1)R^2]—$ and/or $—[CH_2CR^3(CO_2R^4)]—$. $R^2$ is typically phenyl and/or cyano. $R^4$ is typically methyl. Q is typically $CO_2$ and/or CONH. m is typically two to four.

The weight ratio of K units to L units is typically about 99:1 to about 1:99, more typically about 95:5 to about 20:80, even more typically about 80:20 to about 30:70. The weight average molecular weight of the polymeric binder is typically about 2,000 to about 1,000,000; more typically about 5,000 to about 500,000; even more typically about 10,000 to about 100,000.

The betaine-containing co-polymers may be prepared by free radical polymerization. In a typical preparation one or more monomers which are the precursor of the K units and one or more monomers which are the precursors of the L units are co-polymerized.

Free radical polymerization is well known to those skilled in the art and is described, for example, in Chapters 20 and 21, of *Macromolecules*, Vol. 2, 2nd Ed., H. G. Elias, Plenum, N.Y., 1984. Useful free radical initiators are peroxides such as benzoyl peroxide, hydroperoxides such as cumyl hydroperoxide and azo compounds such as 2,2'-azobis(isobutyronitrile) (AIBN). Chain transfer agents, such as dodecyl mercaptan, may be used to control the molecular weight of the compound. Suitable solvents for free radical polymerization include liquids that are inert to the reactants and which will not otherwise adversely affect the reaction, for example, water; esters such as ethyl acetate and butyl acetate; ketones such as 2-butanone, methyl isobutyl ketone, methyl propyl ketone, and acetone; alcohols such as methanol, ethanol, isopropyl alcohol, and butanol; ethers such as dioxane and tetrahydrofuran, and mixtures thereof.

Precursors of the K unit include, for example, styrene, 3-methyl styrene, 4-methyl styrene, 4-methoxy styrene, 4-acetoxy styrene, alpha-methyl styrene, acrylic acid, methyl acrylate, ethyl acrylate, butyl acrylate, n-hexyl acrylate, methacrylic acid, methyl methacrylate, ethyl methacrylate, n-propyl methacrylate, n-butyl methacrylate, n-pentyl methacrylate, neo-pentyl methacrylate, cyclohexyl methacrylate, n-hexyl methacrylate, allyl methacrylate, methyl cyanoacrylate, ethyl cyanoacrylate, vinyl acetate, vinyl butyrate, methyl vinyl ketone, butyl vinyl ketone, acrylonitrile, methacrylonitrile, vinyl chloride, vinyl bromide, 1,3-butadiene, 1,4-pentadiene, acrylamide, methacrylamide, N,N-dimethyl-acrylamide, N,N-dimethyl-methacrylamide, maleic anhydride, maleimide, N-phenyl maleimide, N-cyclohexyl maleimide, N-benzyl maleimide, N-hydroxy maleimide, and mixtures thereof. Preferred precursors for the K unit include styrene, methyl methacrylate, and acrylonitrile. When units derived from both styrene and methyl methacrylate are included in the co-polymer, the K units are a mixture of $—[CH_2C(R^1)R^2]—$ and $—[CH_2CR^3(CO_2R^4)]—$, in which $R^1$ is hydrogen, $R^2$ is phenyl, and $R^3$ and $R^4$ are each methyl. When units derived from both styrene and acrylonitrile are included in the copolymer, the K units are $—[CH_2C(R^1)R^2]—$, in which $R^1$ is hydrogen, and $R^2$ is a mixture of cyano and phenyl.

Precursors of the L unit include, for example, compounds of the general structure:

$CH_2{=}C(R^8)Q((CH_2)_mN^+(CH_3)_2(CH_2)_nSO_3^-—)$, such as [2-(methacryloyloxy)ethyl]dimethyl-(2-sulfoethyl)ammonium betaine, inner salt; [2-(methacryloyloxy)ethyl]dimethyl-(3-sulfopropyl)ammonium betaine, inner salt; [2-(methacryloyloxy)ethyl]dimethyl-(4-sulfobutyl)ammonium betaine, inner salt; [3-(methacryloyloxy)propyl]dimethyl-(2-sulfoethyl)ammonium betaine, inner salt; [3-(methacryloyloxy)propyl]dimethyl-(3-sulfopropyl)ammonium betaine, inner salt; [3-(methacryloyloxy)propyl]dimethyl-(4-sulfobutyl)ammonium betaine, inner salt; [4-(methacryloyloxy)butyl]dimethyl-(3-sulfopropyl)ammonium betaine, inner salt; [5-(methacryloyloxy)pentyl]dimethyl-(3-sulfopropyl)ammonium betaine, inner salt; [6-(methacryloyloxy)hexyl]dimethyl-(3-sulfopropyl)ammonium betaine, inner salt; [7-(methacryloyloxy)heptyl]dimethyl-(3-sulfopropyl)ammonium betaine, inner salt; [8-(methacryloyloxy)octyl]dimethyl-(3-sulfopropyl)ammonium betaine, inner salt; [2-methacryloylamino)ethyl]dimethyl-(2-sulfoethyl)ammonium betaine, inner salt; [2-methacryloylamino)ethyl]dimethyl-(3-sulfopropyl)ammonium betaine inner salt; [2-methacryloylamino)ethyl]dimethyl-(4-sulfobutyl)ammonium betaine, inner salt; [3-methacryloylamino)propyl]dimethyl-(2-sulfoethyl)ammonium betaine, inner salt; [3-methacryloylamino)propyl]dimethyl-(3-sulfopropyl)ammonium betaine, inner salt; [3-methacryloylamino)propyl]dimethyl-(4-sulfobutyl)ammonium betaine, inner salt; [4-methacryloylamino)butyl]dimethyl-(3-sulfopropyl)ammonium betaine, inner salt; [5-methacryloylamino)pentyl]dimethyl-(3-sulfopropyl)ammonium betaine, inner salt; [6-methacryloylamino)hexyl]dimethyl-(3-sulfopropyl)ammonium betaine, inner salt; [7-methacryloylamino)heptyl]dimethyl-(3-sulfopropyl)ammonium betaine, inner salt; [8-methacryloylamino)octyl]dimethyl-(3-sulfopropyl)ammonium betaine, inner salt; [2-(acryloyloxy)ethyl]dimethyl-(3-sulfopropyl)ammonium betaine, inner salt; [3-(acryloyloxy)propyl]dimethyl-(3-sulfopropyl)ammonium betaine, inner salt; [4-(acryloyloxy)butyl]dimethyl-(3-sulfopropyl)ammonium betaine, inner salt; [5-(acryloyloxy)pentyl]dimethyl-(3-sulfopropyl)ammonium betaine, inner salt; [6-(acryloyloxy)hexyl]dimethyl-(3-sulfopropyl)ammonium betaine, inner salt; [7-(acryloyloxy)heptyl]dimethyl-(3-sulfopropyl)ammonium betaine, inner salt; [8-(acryloyloxy)octyl]dimethyl-(3-sulfopropyl)ammonium betaine, inner salt; [2-acryloylamino)ethyl]dimethyl-(3-sulfopropyl)ammonium betaine, inner salt; [3-acryloylamino)propyl]dimethyl-(3-sulfopropyl)ammonium betaine, inner salt; [4-acryloylamino)butyl]dimethyl-(3-sulfopropyl)ammonium betaine, inner salt; [5-acryloylamino)pentyl]dimethyl-(3-sulfopropyl)ammonium betaine, inner salt; [6-acryloylamino)hexyl]dimethyl-(3-sulfopropyl)ammonium betaine, inner salt; [7-acryloylamino)heptyl]dimethyl-(3-sulfopropyl)ammonium betaine, inner salt; [8-acryloylamino)octyl]dimethyl-(3-sulfopropyl)ammonium betaine, inner salt;

compounds of the general structure:

$CH_2{=}C(R^9)(Q(CH_2)_mN^+(CH_3)_2(CH_2)_nCO_2)$ such as [2-(methacryloyloxy)ethyl]dimethyl-(2-carboxyethyl)ammonium betaine, inner salt; [2-(methacryloyloxy)ethyl]dimethyl-(3-carboxypropyl)ammonium betaine, inner salt; [3-(methacryloyloxy)propyl]dimethyl-(2-carboxyethyl)ammonium betaine, inner salt; [3-(methacryloyloxy)propyl]dimethyl-(3-carboxypropyl)-ammonium betaine, inner salt; [2-(methacryloylamino)ethyl]dimethyl-(2-carboxyethyl)ammonium betaine, inner salt; [2-(methacryloylamino)ethyl]dimethyl(3-carboxypropyl)ammonium betaine, inner salt; [3-(methacryloylamino)propyl]-dimethyl-(2-carboxyethyl)ammonium betaine, inner salt; [3-(methacryloylamino)-propyl]dimethyl-(3-carboxypropyl)ammonium betaine, inner salt;

and mixtures thereof.

Substrate

The substrate comprises a support, which may be any material conventionally used to prepare imageable elements useful as lithographic printing plates. The support is preferably strong, stable, and flexible. It should resist dimensional change under conditions of use so that color records will register in a full-color image. Typically, it can be any self-supporting material, including, for example, polymeric films such as polyethylene terephthalate film, ceramics, metals, or stiff papers, or a lamination of any of these materials. Metal supports include aluminum, zinc, titanium, and alloys thereof.

Typically, polymeric films contain a sub-coating on one or both surfaces improve adhesion to subsequent layers. The nature of this layer or layers depends upon the substrate and the composition of subsequent layer or layers. Examples of subbing layer materials are adhesion-promoting materials, such as alkoxysilanes, aminopropyltriethoxysilane, glycidoxypropyltriethoxysilane and epoxy functional polymers, as well as conventional subbing materials used on polyester bases in photographic films.

The surface of an aluminum support may be treated by techniques known in the art, including physical graining, electrochemical graining, chemical graining, and anodizing. The substrate should be of sufficient thickness to sustain the wear from printing and be thin enough to wrap around a cylinder in a printing press, typically about 100 $\mu$m to about 600 $\mu$m. Typically, the substrate comprises an interlayer between the aluminum support and the overlying layer or layers. The interlayer may be formed by treatment of the aluminum support with, for example, silicate, dextrine, hexafluorosilicic acid, phosphate/fluoride, polyvinyl phosphonic acid (PVPA), vinyl phosphonic acid co-polymers, or a water-soluble diazo resin.

The back side of the support (i.e., the side opposite the imageable layer) may be coated with an antistatic agent and/or a slipping layer or matte layer to improve handling and “feel” of the imageable element.

Photothermal Conversion Materials

Imageable elements that are to be imaged with infrared radiation typically comprise an infrared absorber, known as a photothermal conversion material. Photothermal conversion materials absorb radiation and convert it to heat. Although a photothermal conversion material is not necessary for imaging with a hot body, imageable elements that contain a photothermal conversion material may also be imaged with a hot body, such as a thermal head or an array of thermal heads.

The photothermal conversion material may be any material that can absorb radiation and convert it to heat. Suitable materials include dyes and pigments. Typical pigments include, for example, carbon black, Heliogen Green, Nigrosine Base, iron (III) oxide, manganese oxide, Prussian Blue, and Paris blue. The size of the pigment particles should not be more than the thickness of the layer that contains the pigment. Preferably, the size of the particles will be half the thickness of the layer or less.

The photothermal conversion material may be a dye with the appropriate absorption spectrum and solubility. Dyes, especially dyes with a high extinction coefficient in the range of 750 nm to 1200 nm, are preferred. Examples of suitable dyes include dyes of the following classes: methine, polymethine, arylmethine, cyanine, hemicyanine, streptocyanine, squarylium, pyrylium, oxonol, naphthoquinone, anthraquinone, porphyrin, azo, croconium, triarylamine, thiazolium, indolium, oxazolium, indocyanine, indotricarbocyanine, oxatricarbocyanine, phthalocyanine, thiocyanine, thiatricarbocyanine, merocyanine, cryptocyanine, naphthalocyanine, polyaniline, polypyrrole, polythiophene, chalcogenopyrylo-arylidene and bis(chalcogenopyrylo) polymethine, oxyindolizine, pyrazoline azo, and oxazine classes. Absorbing dyes are disclosed in numerous publications, for example, Nagasaka, EP 0,823,327; DeBoer, U.S. Pat. No. 4,973,572; Jandrue, U.S. Pat. No. 5,244,771; Patel, U.S. Pat. No. 5,208,135; and Chapman, U.S. Pat. No. 5,401,618. Other examples of useful absorbing dyes include: ADS-830A and ADS-1064 (American Dye Source, Montreal, Canada), EC2117 (FEW, Wolfen, Germany), Cyasorb IR 99 and Cyasorb IR 165 (Glendale Protective Technology), Epolite IV-62B and Epolite III-178 (Epoline), SpectralR 830A and SpectralR 840A (Spectra Colors), as well as the IR dye whose structures is shown below, and IR Dye A and IR Dye B, whose structures are shown in the Examples.

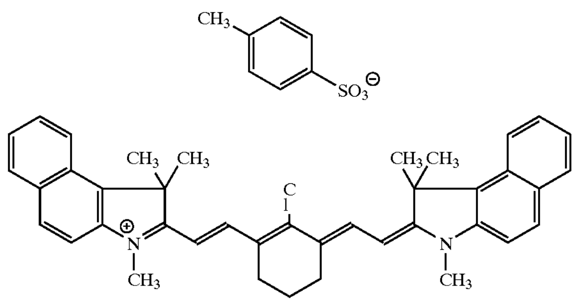

Water-soluble photothermal conversion materials include, for example, cyanine dyes which one or more sulfate and/or sulfonate groups. Other infrared absorbing cyanine anions that contain two to four sulfonate groups are disclosed, for example, in West, U.S. Pat. No. 5,107,063; Pearce, U.S. Pat. No. 5,972,838; Chapman, U.S. Pat. No. 6,187,502; Fabricius, U.S. Pat. No. 5,330,884; and Japanese Laid Open Application No. 63-033477. The preparation of cyanine dyes with polysulfonate anions is disclosed, for example, in U.S. patent application Ser. No. 10/722,257, filed Nov. 25, 2003, incorporated herein by reference. The preparation of N-alkyl sulfate cyanine compounds is disclosed, for example, in U.S. patent application Ser. No. 10/736,364, filed Dec. 15, 2003, incorporated herein by reference.

The amount of photothermal conversion present in the element is generally sufficient to provide an optical density of at least 0.05, and preferably, an optical density of from about 0.5 to at least about 2 to 3 at the imaging wavelength. As is well known to those skilled in the art, the amount of compound required to produce a particular optical density at a particular wavelength can be determined using Beer's law. Although the amount present will depend on the compound or compounds chosen, the photothermal conversion material typically comprises about 0.2 wt % to about 8 wt %, more typically about 0.5 wt % to about 4 wt % of the imageable layer.

The imageable layer is over the substrate, typically on the substrate. In one aspect, the co-polymer and the photothermal conversion material are the only essential ingredients of the imageable layer. However, the imageable layer may also comprise other ingredients such as dyes and surfactants that are conventional ingredients of imageable layers. A surfactant, such as a fluorinated surfactant or a polyethoxylated dimethylpolysiloxane co-polymer, or a mixture of surfactants may be present to help disperse the other ingredients in a coating solvent and/or to act as a coating aid. A dye may be present to aid in the visual inspection of the exposed and/or developed element. Printout dyes distinguish the exposed regions from the unexposed regions during processing. Contrast dyes distinguish the unimaged regions from the imaged regions in the developed imageable element.

Preparation of the Imageable Elements

The imageable elements may be prepared by applying the imageable layer over the surface of the substrate using conventional techniques. The imageable layer may be applied by any conventional method, such as coating or lamination. Typically the ingredients of the imageable layer are dispersed or dissolved in a suitable coating solvent, such as water or a mixture of water and an organic solvent such as methanol, ethanol, iso-propyl alcohol, and/or acetone, and the resulting mixture coated by conventional methods, such as spin coating, bar coating, gravure coating, die coating, slot coating, or roller coating. After coating, the layer is dried to remove the coating solvent. The resulting element may be air dried at ambient temperature or at an elevated temperature, such as at about 65° C. for about 20 seconds in an oven. Alternatively, the resulting imageable element may be dried by blowing warm air over the element. The coating weight for the imageable layer is typically about 0.5 $g/m^2$ to about 2.5 $g/m^2$, preferably about 1 $g/m^2$ to about 1.5 $g/m^2$.

Imaging of the Imageable Elements

The imageable elements may be thermally imaged with a laser or an array of lasers emitting modulated near infrared or infrared radiation in a wavelength region that is absorbed by the imageable element. Infrared radiation, especially infrared radiation in the range of about 800 nm to about 1200 nm, is typically used for imaging. Imaging is conveniently carried out with a laser emitting at about 830 nm, about 1056 nm, or about 1064 nm. Suitable commercially available imaging devices include image setters such as the CREO® Trendsetter (Creo, Burnaby, British Columbia, Canada), the Screen PlateRite model 4300, model 8600, and model 8800 (Screen, Rolling Meadows, Chicago, Ill., USA), and the Gerber Crescent 42T (Gerber).

Alternatively, the imageable element may be thermally imaged using a hot body, such as a conventional apparatus containing a thermal printing head. A suitable apparatus includes at least one thermal head but would usually include a thermal head array, such as a TDK Model No. LV5416 used in thermal fax machines and sublimation printers, the GS618-400 thermal plotter (Oyo Instruments, Houston, Tex., USA), or the Model VP-3500 thermal printer (Seikosha America, Mahwah, N.J., USA).

Imaging produces an imaged element, which comprises imaged regions and complementary unimaged regions. While not being bound by any theory or explanation, it is believed that imaging changes the nature of the surface of the imageable element from hydrophilic to hydrophobic such that the unimaged regions take up fountain solution and the imaged regions repel fountain solution and take up ink. Thus, the imaged imageable element can be directly mounted on press after imaging and treated with ink and fountain solution during the initial press operation.

No development step is needed before mounting on press. The imaged imageable element is mounted on the plate cylinder of a lithographic press and treated with ink and fountain solution by rotating the press cylinders and contacting the element with ink and fountain solution. The imaged regions take up ink and the unimaged regions remain essentially free of ink. This eliminates the separate development step along with both the processor and developer, thus simplifying the printing process and reducing the amount of expensive equipment required.

Alternatively the imageable element may be imaged on-press. For on-press imaging, the imageable element is imaged while mounted on a lithographic printing press cylinder, and the imaged imageable element is treated with ink and fountain solution during the initial press operation. This is especially suitable for computer-to-press application in which the imageable element (or elements, for multiple color presses) is directly imaged on the plate cylinder according to computer generated digital imaging information and, with minimum or no treatment, directly prints out regular printed sheets. On-press imaging may be carried out on, for example, a Quickmaster DI 46-4 press (Heidelberger Drückmaschinen, Heidelberg, Germany).

For presses with integrated inking/dampening system, the ink and fountain solution are emulsified by various press rollers before being transferred to the printing plate as an emulsion of ink and fountain solution. However, in this invention, the ink and fountain solution may be applied in any combination or sequence, as needed for the imaged imageable element.

Numerous aqueous fountain solutions are known to those skilled in the art. Fountain solutions are disclosed, for example, in Matsumoto, U.S. Pat. No. 5,720,800; Archer, U.S. Pat. No. 5,523,194; Chase, U.S. Pat. No. 5,279,648; Bondurant, U.S. Pat. Nos. 5,268,025, 5,336,302, and 5,382,298; Egberg, U.S. Pat. No. 4,865,646; and Daugherty, U.S. Pat. No. 4,604,952. Typical ingredients of aqueous fountain solutions, in addition to water, typically deionized water, include pH buffering systems, such as phosphate and citrate buffers; desensitizing agents, such as dextrin, gum arabic, and sodium carboxymethylcellulose; surfactants and wetting agents, such as aryl and alkyl sulfonates, polyethylene oxides, polypropylene oxides, and polyethylene oxide derivatives of alcohols and phenols; humectants, such as glycerin and sorbitol; low boiling solvents such as ethanol and 2-propanol; sequestrants, such as borax, sodium hexametaphosphate, and salts of ethylenediamine tetraacetic acid; biocides, such as isothiazolinone derivatives; and antifoaming agents. Typical pH ranges for fountain solutions are: about 3.7 to about 6.7 for sheet fed presses, and about 7.0 to about 9.6 for web presses.

INDUSTRIAL APPLICABILITY

The imageable elements are useful as lithographic printing plate precursors that do not require a development step. As described above, once the imageable element has been imaged, printing can then be carried out by applying a fountain solution and a lithographic ink to the image on its surface. The fountain solution is taken up by the unimaged regions, and the ink is taken up by the imaged regions. The ink is then transferred to a suitable receiving material (such as cloth, paper, metal, glass or plastic) either directly or indirectly using an offset printing blanket to produce a printed image thereon.

The advantageous properties of this invention can be observed by reference to the following examples, which illustrate but do not limit the invention.

EXAMPLES

Except where indicated, the indicated percentages are percentages by weight based on the total solids in the coating solution.

| Glossary | |
|---|---|
| AIBN | 2,2'-Azobisisobutyronitrile (DuPont, Wilmington, Delaware, USA) |
| CREO ® Trendsetter 3244x | Commercially available platesetter, using Procom Plus software and operating at a wavelength of 830 nm (Creo Products, Burnaby, BC, Canada) |
| IR Dye A | See structure below |
| IR Dye B | See structure below |
| LODYNE ® 103A | Fluorosurfactant, (Ciba Specialty Chemicals, Tarrytown, NY, USA) |
| MMA | Methyl methacrylate |
| MNP | [3-Methacryloylamino)propyl]dimethyl-(3-sulfopropyl)ammonium betaine, inner salt; $CH_2{=}C(CH_3)CONH(CH_2)_3N(CH_3)_2(CH_2)_3SO_3$ (Aldrich, Milwaukee, WI, USA) |
| MOE | [2-(Methacryloyloxy)ethyl]dimethyl-(3-sulfopropyl)ammonium betaine, inner salt; $CH_2{=}C(CH_3)CO_2(CH_2)_2N(CH_3)_2(CH_2)_3SO_3$ (Aldrich, Milwaukee, WI, USA) |
| Substrate A | 0.3 mm gauge, aluminum sheet which had been electrograined, anodized and treated with a solution of polyvinyl phosphonic acid |
| Substrate B | Brush-grained and phosphoric acid anodized aluminum substrate that had been post-treated with polyacrylic acid |

Dye A

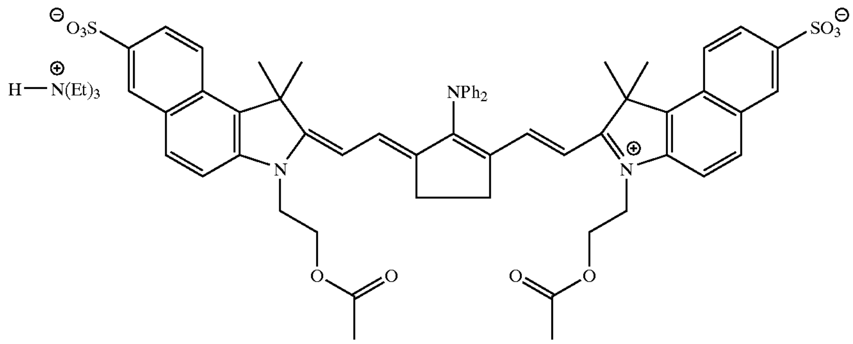

Dye B

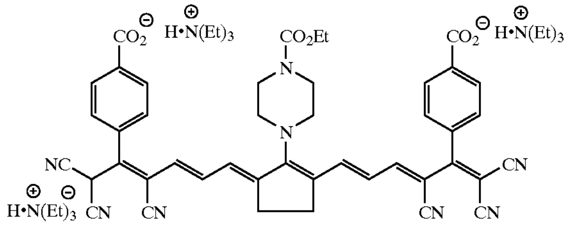

Example 1

This example illustrates a general procedure for synthesis of the sulfobetaine-containing co-polymers. 0.2 g of AIBN, 5 g of MMA, 5.0 g of sulfobetaine monomer, 40 g of n-propanol, and 40 g of water were placed in a 150-ml 3-necked flask equipped with magnetic stirring, temperature controller and nitrogen inlet. The reaction mixture was stirred and heated at 60° C. under nitrogen for 6 hr. AIBN (0.1 g) was added and heating and stirring continued for an additional 16 hr. After the reaction mixture was cooled to room temperature, about 90 g of polymer solution was obtained. The polymers are shown in Table 1.

TABLE 1

Poly(sulfobetaine) copolymer list

| | monomers (wt %) | | Solvent (wt %) | | | |
|---|---|---|---|---|---|---|
| Sample ID | MMA | Sulfobetaine | n-Pr | water | N.V. (%) | initiator |
| Polymer 1 | 50 | (MOE) 50 | 50 | 50 | 11.2 | AIBN |
| Polymer 2 | 70 | (MOE) 30 | 50 | 50 | 11.1 | AIBN |
| Polymer 3 | 80 | (MOE) 20 | 50 | 50 | 10.8 | AIBN |
| Polymer 4 | 60 | (MOE) 40 | 50 | 50 | 11.4 | AIBN |
| Polymer 5 | 70 | (MNP) 30 | 50 | 50 | 10.8 | AIBN |

MMA = methyl methacrylate
MOE = [2-(methacryloyloxy)ethyl]dimethyl-(3-sulfopropyl) ammonium hydroxide
MNP = [3-(methacryloylamino)propyl]dimethyl-(3-sulfopropyl) ammonium hydroxide The % of non-volatiles (N.V.) is given in Table 1. The polymer was not isolated. The polymer solution was used to prepare the coating solutions.

Example 2

A coating solution was prepared by combining 2.68 g of Polymer 1 (from Example 1, Table 1), 0.019 g of Dye A, 0.05 g of 10% LODYNE® 103A, and 2.32 g of water. The coating solution was coated onto Substrate A using a wire wound bar. The resulting imageable element, consisting of the imageable layer on the substrate, was dried in a Ranar conveyor oven at about 76° C. for about one minute. The dry coating weight of the imageable layers was about 1.0 g/m$^2$.

The resulting imageable element was placed on a CREO® Trendsetter 3244x imagesetter and imaged with 830 nm infrared laser radiation at a power of 12 W and a range of drum speeds from 210 to 50 rpm (corresponding to exposure energies ranging from 130 to 540 mJ/cm$^2$). The imaged imageable element was treated with aqueous fountain solution that contained about 23.5 ml/L (3 oz per gallon) Varn Litho Etch142W (Varn International, Addison, Ill., USA), and about 23.5 mL (3 oz per gallon) Varn PAR (alcohol substitute) in water. A weak image was formed at about 540-mJ/cm$^2$ exposure energy. When ink was applied, the image area did not receive ink.

Example 3

A coating solution was prepared by combining 27.0 g of Polymer 2 (from Example 1, Table 1), 0.22 g of Dye A, 0.07 g of 10% LODYNE® 103A, and 22.7 g of water. Substrate B was mounted on a hot rotating drum. The substrate was then contacted with the coating solution, which was delivered to the substrate by a pump. The resulting imageable element, consisting of the imageable layer on the substrate, was dried by blowing hot air at 65° C. for about 2 minutes. The dry coating weight of the imageable layer was about 1.5 g/m$^2$.

The imageable element was imaged as in Example 2 and the imaged imageable element treated with fountain solution and ink by rubbing ink and fountain solution on the imaged imageable element. The minimum exposure energy to achieve a good image was about 250 mJ/cm$^2$.

A second imaged imageable element precursor, prepared similarly, was imaged at 400 mJ/cm$^2$ and resulting printing plate mounted directly on an A. B. Dick duplicator press (A. B. Dick, Niles, Ill., USA). The press was charged with Van Son Rubber Base Ink (Van Son Ink, Mineola, N.Y., USA). The aqueous fountain solution contained about 23.5 ml/L (3 oz per gallon) Varn Litho Etch142W (Varn International, Addison, Ill., USA), and about 23.5 ml/L (3 oz per gallon)

Varn PAR (alcohol substitute) in water. This fountain solution had a pH of 4. The printing plate printed at least 250 copies of good prints.

Example 4

A coating solution was prepared by combining 5.4 g of Polymer 3 (from Example 1, Table 1), 0.038 g of Dye A, 0.1 g of 10% LODYNE® 103A, 1.0 g of n-propanol and 3.6 g of water. The coating solution was coated onto Substrate A using a wire wound bar. The resulting imageable precursor, consisting of the imageable layer on the substrate, was dried in a Ranar conveyor oven at about 76° C. for about one minute. The dry coating weight of the imageable layers was about 1.0 g/m$^2$.

The precursor was imaged as in Example 2 and the imaged imageable element treated with fountain solution and ink by rubbing ink and fountain solution on the imaged imageable element. The minimum exposure energy to achieve an image was about 200 mJ/cm$^2$, with ink scumming in non-exposed area.

Example 5

A coating solution was prepared by combining 5.6 g of Polymer 4 (from Example 1, Table 1), 0.038 g of Dye A, 0.05 g of 10% LODYNE® 103A, and 4.4 g of water. The coating solution was coated onto Substrate A using a wire wound bar. The resulting imageable precursor, consisting of the imageable layer on the substrate, was dried in a Ranar conveyor oven at about 76° C. for about one minute. The dry coating weight of the imageable layers was about 1.0 g/m$^2$.

The precursor was imaged as in Example 2. The exposed precursor was subsequently treated with fountain solution, and a weak image was formed at about 400 mJ/cm$^2$ exposure energy. When ink was applied, the image areas barely receive ink.

Example 6

A coating solution was prepared by combining 8.1 g of Polymer 5 (from Example 1, Table 1), 0.057 g of Dye A, 0.15 g of 10% LODYNE® 103A, 2.3 g of n-propanol and 5.7 g of water. The coating solution was coated onto Substrate A using a wire wound bar. The resulting imageable precursor, consisting of the imageable layer on the substrate, was dried in a Ranar conveyor oven at about 76° C. for about one minute. The dry coating weight of the imageable layers was about 1.0 g/m$^2$.

The imageable element was imaged as in Example 2. The imaged imageable element was subsequently treated with fountain solution and ink, and a good image was formed at about 300 mJ/cm$^2$ exposure energy.

Example 7

A coating solution was prepared by combining 22.0 g of Polymer 2 (from Example 1, Table 1), 0.19 g of Dye A, 0.08 g of 10% LODYNE® 103A, 6.7 g of n-propanol and 28.1 g of water. Substrate A was mounted on a hot rotating drum. The substrate was then contacted with the coating solution, which was delivered to the substrate by a pump. The resulting imageable element, consisting of the imageable layer on the substrate, was dried by blowing hot air at 65° C. for about 2 min. The dry coating weight of the imageable layer was about 1.0 g/m$^2$.

The resulting imageable element was imaged as in Example 2. The imaged imageable element treated with fountain solution and ink. The minimum exposure energy to achieve a good image was about 200 mJ/cm$^2$.

A second precursor, prepared similarly, was imaged at 300 mJ/cm$^2$ and mounted on the A. B. Dick Press. The resulting printing plate printed 250 copies with background scumming.

Example 8

A coating solution was prepared by combining 22.3 g of Polymer 2 (from Example 1, Table 1), 0.24 g of Dye B, 0.07 g of 10% LODYNE® 103A, 3.5 g of n-propanol and 27.3 g of water. Substrate A was mounted on a hot rotating drum. The substrate was then contacted with the coating solution, which was delivered to the substrate by a pump. The resulting imageable element, consisting of the imageable layer on the substrate, was dried by blowing hot air at 65° C. for about 2 min. The dry coating weight of the imageable layer was about 1.5 g/m$^2$.

The resulting imageable element was imaged as in Example 2. The imaged imageable element was treated with fountain solution and ink. The minimum exposure energy to achieve a good image was about 200 mJ/cm$^2$.

A second precursor, prepared similarly, was imaged at 300 mJ/cm$^2$ and mounted on the A. B. Dick Press. The resulting printing plate printed at least 250 copies of good prints.

Example 9

A coating solution was prepared by combining 22.4 g of Polymer 2 (from Example 1, Table 1), 0.24 g of Dye B, 0.07 g of 10% LODYNE® 103A, 4.7 g of n-propanol and 22.6 g of water. Substrate A was mounted on a hot rotating drum. The substrate was then contacted with the coating solution, which was delivered to the substrate by a pump. The resulting imageable element, consisting of the imageable layer on the substrate, was dried by blowing hot air at 65° C. for about 2 min. The dry coating weight of the imageable layer was about 1.5 g/m$^2$.

The resulting imageable element was imaged as in Example 2. The imaged imageable element was treated with fountain solution and ink. The minimum exposure energy to achieve a good image was about 200 mJ/cm$^2$.

A second precursor, prepared similarly, was imaged at 300 mJ/cm$^2$ and mounted on the A. B. Dick Press. The resulting printing plate printed at least 250 copies of good prints.

Example 10

This example illustrates the synthesis of [2-(methacryloyloxy)ethyl]dimethyl-(2-carboxyethyl)ammonium betaine, inner salt, a carboxybetaine-containing monomer, and polymerization of the monomer to form a carboxybetaine-containing polymer.

In a 50-ml flask, 6.3 g (0.04 mol) of N,N-dimethylaminoethyl methacrylate (Aldrich, Milwaukee, Wis., USA) in 8 g of 2-butanone was stored at 0° C. for 1 hr. 2.9 g (0.04 mol) of β-propiolactone (Aldrich, Milwaukee, Wis., USA) in 6 g of 2-butanone cooled at 0° C. was added dropwise to the flask. The resulting mixture was stirred at room temperature for 3 hr and stored in refrigerator for 3 hr. A white precipitate formed. 4.7 g of the solid carboxybetaine-containing monomer was collected by filtration. Proton NMR (in $D_2O$): δ 1.80 (3H, s), 2.59 (2H, t), 3.02 (6H, s), 3.52 (2H, t), 3.63 (2H, t), 4.50 (2H, m), 5.62 (1H, m) and 6.05 (1H, m).

0.1 g of AIBN, 3.5 g of methyl methacrylate, 1.5 g of the carboxybetaine-containing monomer, 20 g of n-propanol, and 20 g of water were placed in a 100 ml, 3-necked flask, equipped with magnetic stirring, temperature controller and nitrogen inlet. The reaction mixture was heated to 60° C. and stirred under nitrogen for 6 hr. 0.05 g of AIBN was added, and heating and stirring continued for an additional 16 hr. After the reaction mixture was cooled to room temperature, about 43 g of polymer solution was obtained. The % of non-volatiles was about 9.2%.

Example 11

A coating solution was prepared by combining 9.8 g of the carboxybetaine-containing polymer from Example 10, 0.057 g of Dye A, 0.15 g of 10% LODYNE® 103A, 2.6 g of n-propanol and 2.6 g of water. The coating solution was coated onto Substrate A using a wire wound bar. The resulting imageable precursor, consisting of the imageable layer on the substrate, was dried in a Ranar conveyor oven at about 76° C. for about 1 min. The dry coating weight of the imageable layers was about 1.0 g/m$^2$.

The imageable element was imaged as in Example 2. The imaged imageable element was subsequently treated with fountain solution and ink. A good image was formed at about 300 mJ/cm$^2$ exposure energy.

Having described the invention, we now claim the following and their equivalents.

What is claimed is:

1. An imageable element comprising an imageable layer over a support, in which the imageable layer consists essentially of a photothermal conversion material and a polymeric binder that comprises a polymer backbone with betaine-containing side chains, in which the betaines are selected from the group consisting of sulfobetaines, carboxybetaines, and mixtures thereof.

2. The element of claim 1 in which the polymeric binder comprises a polymer backbone with sulfobetaine-containing side chains.

3. The element of claim 1 in which the polymeric binder comprises a polymer backbone with carboxybetaine-containing side chains.

4. The element of claim 1 in which the polymeric binder comprises K units and L units in which:

the K units are selected from —[$CH_2C(R^1)R^2$]—, —[$CH_2CR^3(CO_2R^4)$]—, —[$CH_2CR^3(CON(R^5)(R^6))$]—, —[$C(R^7)(COECO)C(R^7)$]—, and mixtures thereof;

the L units are selected from —[$CH_2C(R^8)(Q(CH_2)_mN(CH_3)_2(CH_2)_nSO_3)$]—, —[$CH_2C(R^9)(Q(CH_2)_mN(CH_3)_2(CH_2)_nCO_2)$]—, and mixtures thereof;

in which:

each $R^1$, $R^3$, $R^7$, $R^8$, and $R^9$, is independently hydrogen, methyl, or a mixture thereof;

$R^2$ is hydrogen, methyl, phenyl, substituted phenyl, halogen, cyano, alkoxy of one to four carbon atoms, acyl of one to five carbon atoms, acyloxy of one to five carbon atoms, vinyl, allyl, or a mixture thereof;

$R^4$, $R^5$, and $R^6$ are each independently hydrogen, alkyl of one to six carbon atoms, cycloalkyl of one to six carbon atoms, phenyl, or a mixture thereof;

E is oxygen or $NR^{10}$ in which $R^{10}$ is hydrogen, hydroxyl, phenyl, substituted phenyl, alkyl of one to six carbon atoms, benzyl, or a mixture thereof;

Q is $CO_2$, O, CONH, $CH_2$, or a mixture thereof;

m is 1 to 8;

n is 2 to 4; and the ratio of K units to L units is about 99:1 to about 1:99.

5. The element of claim 4 in which:

the K units are selected from —[$CH_2C(R^1)R^2$]—, —[$CH_2CR^3(CO_2R^4)$]— and mixtures thereof;

$R^2$ is phenyl, cyano, or a mixture thereof;

$R^4$ is methyl;

Q is $CO_2$, CONH, or a mixture thereof;

m is 1 to 4; and the ratio of K units to L units is about 95:5 to about 20:80.

6. The element of claim 5 in which the L units are —[$CH_2$—$C(R^8)(Q(CH_2)_mN(CH_3)_2(CH_2)_nSO_3)$]—.

7. The element of claim 5 in which the L units are —[$CH_2$—$C(R^9)(Q(CH_2)_mN(CH_3)_2(CH_2)_nCO_2)$]—.

8. A method for forming an image, the method comprising the steps of:

a) thermally imaging an imageable element and forming an imaged imageable element that comprises imaged and unimaged regions in an imageable layer, in which:

the imageable element comprises the imageable layer over a support;

the imageable layer comprises a photothermal conversion material and a polymeric binder;

the binder comprises a polymer backbone with betaine-containing side chains, in which the betaines are selected from the group consisting of sulfobetaines, carboxybetaines, and mixtures thereof; and b) without a development step, treating the imaged with ink, fountain solution, or a mixture of ink and fountain solution whereby the imaged regions take up ink and the unimaged regions remain essentially free of ink.

9. The method of claim 8 in which the polymeric binder comprises a polymer backbone with sulfobetaine-containing side chains.

10. The method of claim 8 in which the polymeric binder comprises a polymer backbone with carboxybetaine-containing side chains.

11. The method of claim 8 in which the imageable layer consists essentially of the photothermal conversion material and the polymeric binder.

12. The method of claim 8 in which the polymeric binder comprises K units and L units in which:

the K units are selected from —[$CH_2C(R^1)R^2$]—, —[$CH_2CR^3(CO_2R^4)$]—, —[$CH_2CR^3(CON(R^5)(R^6))$]—, —[$C(R^7)(COECO)C(R^7)$]—, and mixtures thereof;

the L units are selected from —[$CH_2C(R^8)(Q(CH_2)_mN(CH_3)_2(CH_2)_nSO_3)$]—, —[$CH_2C(R^9)(Q(CH_2)_mN(CH_3)_2(CH_2)_nCO_2)$]—, and mixtures thereof;

in which:

each $R^1$, $R^3$, $R^7$, $R^8$, and $R^9$, is independently hydrogen, methyl, or a mixture thereof;

$R^2$ is hydrogen, methyl, phenyl, substituted phenyl, halogen, cyano, alkoxy of one to four carbon atoms, acyl of one to five carbon atoms, acyloxy of one to five carbon atoms, vinyl, allyl, or a mixture thereof;

$R^4$, $R^5$, and $R^6$ are each independently hydrogen, alkyl of one to six carbon atoms, cycloalkyl of one to six carbon atoms, phenyl, or a mixture thereof;

E is oxygen or $NR^{10}$ in which $R^{10}$ is hydrogen, hydroxyl, phenyl, substituted phenyl, alkyl of one to six carbon atoms, benzyl, or a mixture thereof;

Q is $CO_2$, O, CONH, $CH_2$, or a mixture thereof;

m is 1 to 8;

n is 2 to 4; and the ratio of K units to L units is about 99:1 to about 1:99.

13. The method of claim 12 in which:

the K units are selected from —$[CH_2C(R^1)R^2]$—, —$[CH_2CR^3(CO_2R^4)]$— and mixtures thereof;

$R^2$ is phenyl, cyano, or a mixture thereof;

$R^4$ is methyl;

Q is $CO_2$, CONH, or a mixture thereof;

m is 1 to 4; and the ratio of K units to L units is about 95:5 to about 20:80.

14. The method of claim 13 in which the L units are —$[CH_2$—$C(R^8)(Q(CH_2)_mN(CH_3)_2(CH_2)_nSO_3)]$—.

15. The method of claim 13 in which the L units are —$[CH_2$—$C(R^9)(Q(CH_2)_mN(CH_3)_2(CH_2)_nCO_2)]$—.

16. The method of claim 13 in which the imageable layer consists essentially of the photothermal conversion material and the polymeric binder.

17. The method of claim 13 in which the polymeric binder consists essentially of the K units and the L units.

18. The method of claim 13 additionally comprising the step of transferring the ink to a receiving material.

19. The method of claim 8 additionally comprising the step of transferring the ink to a receiving material.

* * * * *